(12) United States Patent
Garrity et al.

(10) Patent No.: US 8,513,982 B1
(45) Date of Patent: Aug. 20, 2013

(54) SAMPLE AND HOLD CIRCUIT AND DIFFERENTIAL SAMPLE AND HOLD CIRCUIT

(75) Inventors: Douglas A. Garrity, Gilbert, AZ (US); Ahmad H. Atriss, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/424,064

(22) Filed: Mar. 19, 2012

(51) Int. Cl.
*G11C 27/02* (2006.01)

(52) U.S. Cl.
USPC ............................................. 327/95; 327/96

(58) Field of Classification Search
USPC .................. 327/91, 94, 95, 52, 54, 65, 67, 96
See application file for complete search history.

(56) References Cited

U.S. PATENT DOCUMENTS

| | | | | |
|---|---|---|---|---|
| 5,506,526 | A * | 4/1996 | Seesink | 327/91 |
| 7,113,116 | B2 * | 9/2006 | Brewer et al. | 341/122 |
| 8,319,550 | B2 * | 11/2012 | Prasad et al. | 330/9 |
| 2011/0279148 | A1 * | 11/2011 | Watanabe | 327/96 |

OTHER PUBLICATIONS

Nicollini, G., et al. "A Fully Differential Sample-and-Hold Circuit for High-Speed Applications," IEEE Journal of Solid-State Circuits, vol. 24, No. 5; Oct. 1989.
Gregorian, R., et al., "Analog MOS Integrated Circuits for Signal Processing," Wiley Series on Filters: Design, Manufacturing, and Applications, pp. 415-416, 456; 1986.

* cited by examiner

*Primary Examiner* — Lincoln Donovan
*Assistant Examiner* — Jung H. Kim
(74) *Attorney, Agent, or Firm* — Ingrassia Fisher & Lorenz, P.C.

(57) ABSTRACT

A sample and hold circuit is provided. The circuit includes a first switch configured to receive an input, a second switch coupled to a second end of the first switch, a first capacitor coupled to the second end of the first switch, a third switch coupled to a second end of the first capacitor, a fourth switch coupled between the second end of the first capacitor and ground, an op-amp having a first input coupled to the second end of the third switch and a second input connected to ground and an output coupled to the second end of the second switch, a fifth switch coupled to a second end of the third switch, a second capacitor coupled between the output of the op-amp and a second end of the fifth switch, and a sixth switch coupled between the second end of the second capacitor and ground.

19 Claims, 2 Drawing Sheets

SAMPLE AND HOLD CIRCUIT AND DIFFERENTIAL SAMPLE AND HOLD CIRCUIT

TECHNICAL FIELD

The following relates to circuits, and more particularly to sample and hold circuits having no reset period.

BACKGROUND

Sample and hold circuits are useful tools for sampling an analog signal. Sample and hold circuits, as the name suggests, sample an input signal and hold the sampled input signal at an output of the circuit. The output of sample and hold circuits is often fed into an analog-to-digital converter which provides a digital representation of the input signal.

DESCRIPTION OF THE DRAWING FIGURES

Exemplary embodiments will hereinafter be described in conjunction with the following drawing figures, wherein like numerals denote like elements.

DETAILED DESCRIPTION

According to various exemplary embodiments, a sample and hold circuit is provided. The sample and hold circuit includes an operational amplifier, two capacitors and six switches. The sample and hold circuit operates in two phases. In the first phase a first capacitor samples an input analog signal while an electrically isolated second capacitor and an operational amplifier hold a voltage from a previous second phase at the output of the sample and hold circuit. In the second phase, the first capacitor and the operational amplifier hold the voltage sampled by the first capacitor in the prior first phase at the output of the sample and hold circuit while the second capacitor samples the voltage at the output in order to hold the voltage during the subsequent first phase.

Figure 1:
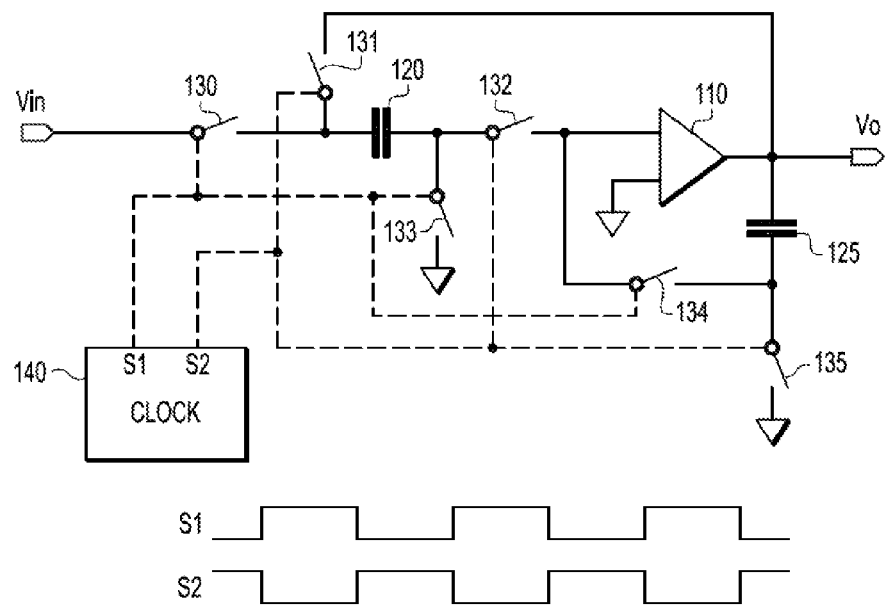
FIG. 1 is a circuit diagram of an exemplary sample and hold circuit, in accordance with an embodiment.

FIG. 1 is a circuit level diagram of an exemplary sample and hold circuit 100 (hereinafter referred to as circuit 100), in accordance with an embodiment. The circuit 100 can be used in any sample and hold application. For example, the circuit 100 can be used in conjunction with an analog-to-digital converter (ADC) to provide a digital representation of a sampled analog signal. The analog signal can be, for example, from an automotive radar application such as a collision avoidance system or an adaptive cruise control system. The analog signal could also be from a video camera, a received radio or TV signal or from an imaging application such as an ultra-sound. The circuit 100 may be used in both sub-sampling applications and non-sub-sampling applications. In sub-sampling applications, the frequency of the analog input signal may be higher than a sampling frequency of the circuit 100. When the frequency of the input voltage signal is greater than the sampling frequency of circuit 100, the circuit 100 generates an output signal based upon the difference in the frequencies. For example, if the analog input signal is oscillating at, for example, forty-two megahertz (MHz) and the circuit 100 samples the analog input signal at, for example, forty MHz, the circuit 100 would generate an output signal oscillating at around two MHz. The sample rate of the circuit 100 can vary depending upon the application. The circuit 100 can also be used in applications where the sampled voltage has to be held for an entire clock period. Traditional sample and hold circuits have reset periods where the output of the sample and hold circuit returns to zero. However, as discussed in further detail below, the circuit 100 utilizes a second capacitor to sample and hold the voltage such that the circuit 100 holds a voltage from a prior hold phase during a sampling phase.

In one embodiment, for example, the circuit 100 includes one operational amplifier (op amp) 110, two capacitors 120 and 125 and six switches 130-135. One of ordinary skill in the art would recognize that the switches 130-135 could be implemented in a variety of ways, for example, CMOS transmission gates, MOS transistors, or any other type of switch or combination thereof. Each switch 130-135 and capacitor 120 and 125 has a first end and a second end. In one embodiment, for example, the capacitors 120 and 125 may be one picofarad (1 pF). The first end of switch 130 is configured to receive a voltage Vin from an input analog signal. A second switch 131 is coupled between a second end of the switch 130 and the output Vo of the circuit 100. A first end of the capacitor 120 is coupled to the second end of the switch 130. The second end of the capacitor 120 is coupled to a first end of switch 132 and the first end of switch 133. The second end of switch 132 is coupled to a first input of the op amp 110. The second input of the op amp 110 is coupled to ground. The output of the op amp 110 is coupled to the output Vo of the circuit 100. The second end of switch 133 is also coupled to ground. The first end of switch 134 is coupled to second end of switch 133. A first end of the capacitor 125 is coupled to the output Vo of the circuit 100 and the second end of the capacitor 125 is coupled to the second end of switch 134. Finally, the first end of switch 135 is coupled to the second end of the second capacitor 125 and the second end of switch 135 is coupled to ground.

The switches 130-135 are controlled to switch the circuit 100 from the first phase to the second phase. In one embodiment, for example, the circuit further includes a clock generator 140. The clock generator 140 outputs a first control signal S1 and a second control signal S2, which could be an inverse of the first control signal S1. The switches 130, 133 and 134 receive the first control signal S1 and the switches 131, 132 and 135 receive the second control signal S2. In one embodiment, for example, the control signals S1 and S2 may be square waves, as illustrated in FIG. 1. One of ordinary skill in the art would recognize that the control signals S1 and S2 can be generated in any fashion and may be non-overlapping with respect to each other and may include complementary and delayed versions of S1 and S2 in accordance with principles that are well known in the art.

Figure 2:
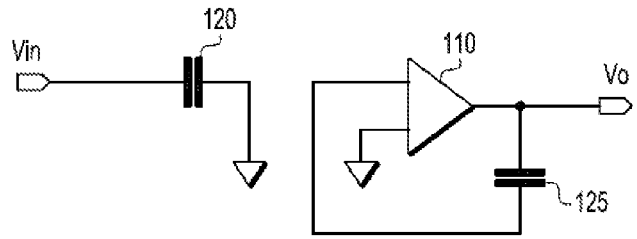
FIG. 2 is a circuit diagram of the exemplary sample and hold circuit illustrated in FIG. 1 when the circuit is in a first phase, in accordance with an embodiment.

FIG. 2 is a circuit diagram of the exemplary sample and hold circuit 100 illustrated in FIG. 1 when the circuit 100 is in a first phase, in accordance with an embodiment. In the first phase, switches 130, 133 and 134 are closed and switches 131, 132 and 135 are open, resulting in the two electrically isolated circuits illustrated in FIG. 2. In the first phase, a charge from the analog input signal is stored onto the capacitor 120. Because the input sampling is done merely with the capacitor 120, the circuit 100 uses passive sampling. In other words, the op amp 110 of the circuit 100 is not involved in the sampling stage. Accordingly, the amplifier does not have to process a high speed input signal when sample and hold circuit 100 is used in a sub-sampling application. The op amp 110 and the capacitor 125, which are isolated from the capacitor 120, hold a charge from a previous phase two at the output Vo of the circuit. In other words, the output Vo of the circuit is equal to the output of the circuit from the previous phase delayed by one-half clock cycle.

Figure 3:
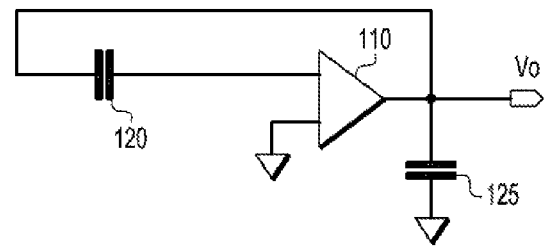
FIG. 3 is a circuit diagram of the exemplary sample and hold circuit illustrated in FIG. 1 when the circuit is in a second phase, in accordance with an embodiment.

FIG. 3 is a circuit diagram of the exemplary sample and hold circuit 100 illustrated in FIG. 1 when the circuit is in a second phase, in accordance with an embodiment. In the second phase, switches 130, 133 and 134 are open and switches 131, 132 and 135 are closed, resulting in the circuit illustrated in FIG. 3. In the second phase, the charge stored on the capacitor 120 in the first phase is held at the output Vo by the op amp 110 and the capacitor 120. Accordingly, the output of the circuit Vo is equal to the voltage input to the circuit in phase one delayed by one-half clock cycle. Furthermore, the output voltage V0 is sampled onto capacitor 125 so that the circuit can hold the output voltage through a following first phase.

Figure 4:
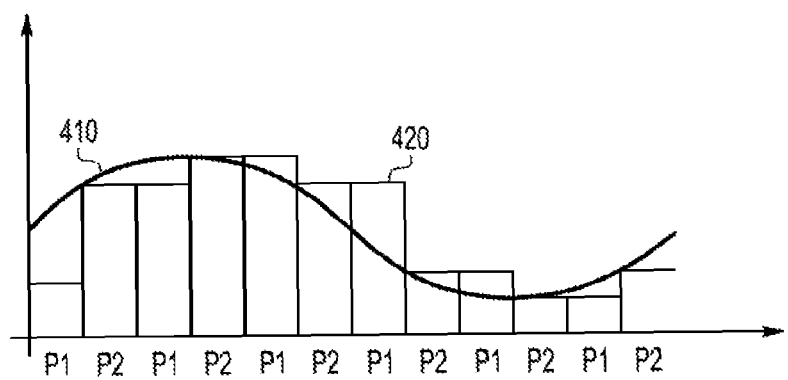
FIG. 4 is a chart illustrating an exemplary input signal and output signal for the circuit illustrated in FIGS. 1-3.

FIG. 4 is a graphic illustrating an exemplary input signal 410 and output signal 420 for the circuit 100 illustrated in FIGS. 1-3. In this embodiment, the input signal 410 is a sinusoidal wave. While the sampling rate (i.e., the clock frequency of the clock 140 illustrated in FIG. 1) is illustrated as being greater than the frequency of the input voltage signal, the input signal 410 can have a frequency greater than the sampling rate. The output signal Vo during the first phase P1 is equal to the output voltage delayed by one-half clock cycle (i.e., the input voltage delayed by a full clock cycle). The output voltage during the second phase P2 is equal to the input voltage delayed by one-half clock cycle. In other words, the input voltage is sampled during a first phase and that sampled input voltage is held as the output voltage V0 during the second phase and the following first phase. Accordingly, circuit 100 does not experience a reset where the output voltage drops to zero.

Figure 5:
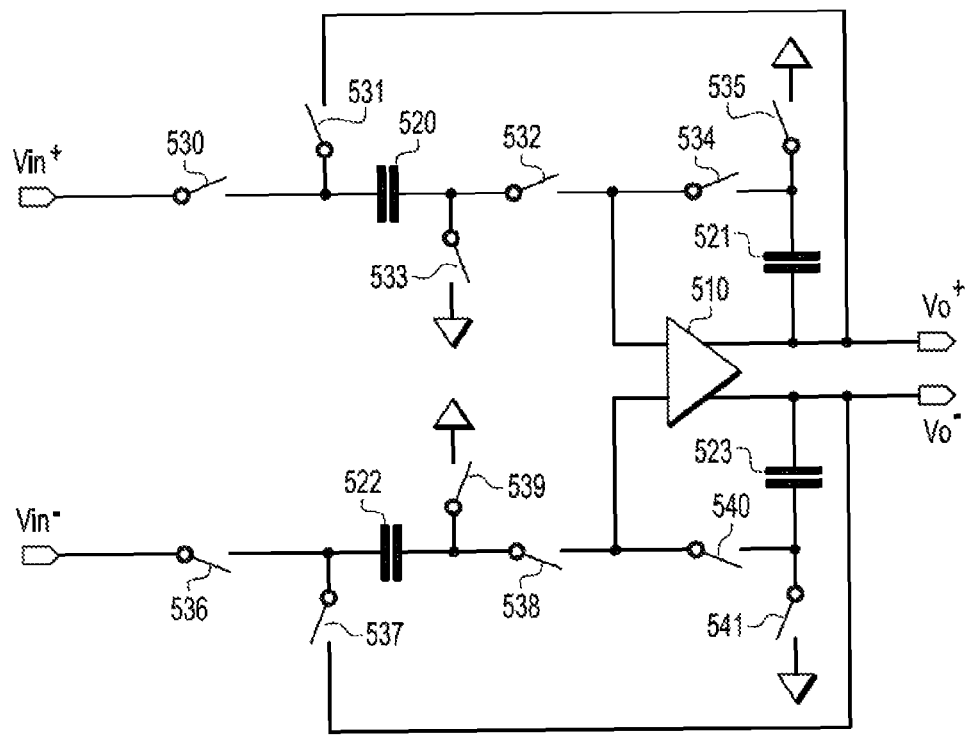
FIG. 5 is a circuit diagram of an exemplary differential sample and hold circuit 500, in accordance with an embodiment.

FIG. 5 is a circuit diagram of an exemplary differential sample and hold circuit 500, in accordance with an embodiment. The differential sample and hold circuit 500 (hereinafter referred to as circuit 500) includes one operational amplifier (op amp) 510, four capacitors 520-523 and twelve switches 530-541. Each switch 530-541 and capacitor 520-523 has a first end and a second end. The first end of switch 530 is configured to be coupled to a positive input signal Vin$^+$. The positive input signal Vin$^+$ may be an alternating current (AC) voltage having a first frequency. A second switch 531 is coupled between a second end of the switch 530 and a first output of the op amp 510. A first end of the capacitor 520 is coupled to the second end of the switch 530. The second end of the capacitor 520 is coupled to a first end of switch 532 and the first end of switch 533. A second end of switch 532 is coupled to a first input of the op amp 510. The second end of switch 533 is also coupled to ground. The first end of switch 534 is coupled to second end of the switch 532. A first end of the capacitor 521 is coupled to the first output Vo$^+$ of the circuit 500 and the second end of the capacitor 521 is coupled to the second end of switch 534. The first output of the op amp 510 is coupled to the first output Vo$^+$ of the circuit. The first end of switch 535 is coupled to the second end of capacitor 521 and the second end of the sixth switch 535 is coupled to ground.

The first end of switch 536 is coupled to a negative input signal Vin$^-$. The negative input voltage may be an alternating current (AC) voltage having a first frequency which is 180 degrees out of phase with the positive input signal Vin$^+$. The switch 537 is coupled between a second end of the switch 536 and a second output Vo$^-$ of the circuit 500. A first end of the capacitor 522 is coupled to the second end of switch 536. The second end of the capacitor 522 is coupled to a first end of switch 538 and the first end of switch 539. The second end of the switch 538 is coupled to a second input of the op amp 510. The second output of the op amp 510 is coupled to the second output Vo$^-$ of the circuit 500. The second end of the switch 539 is also coupled to ground. The first end of the switch 540 is coupled to second end of switch 538. A first end of the capacitor 523 is coupled to the second output Vo$^-$ of the circuit 500 and the second end of the capacitor 523 is coupled to the second end of switch 540. The first end of switch 541 is coupled to the second end of the capacitor 523 and the second end of switch 541 is coupled to ground.

In operation, the circuit 500 is similar to the circuit 100 illustrated in FIG. 1. The switches 530-541 are each configured to receive a control signal controlling when the switch is open or closed. Switches 530, 532, 534, 536, 538 and 540 are configured to receive a first control signal and switches 531, 533, 535, 537, 539 and 541 are configured to receive a second control signal. In one embodiment, for example, the first control signal may be generated by a clock and the second control signal may be an inverse of the first control signal such that when switches 530, 532, 534, 536, 538 and 540 are open, switches 531, 533, 535, 537, 539 and 541 are closed and when switches 530, 532, 534, 536, 538 and 540 are closed, switches 531, 533, 535, 537, 539 and 541 are open.

In a first phase, when switches 530, 532, 534, 536, 538 and 540 are closed and switches 531, 533, 535, 537, 539 and 541 are open, a charge is stored onto capacitors 520 and 522. Furthermore, the op amp 510 and capacitors 521 and 523 hold a charge from a previous second phase at the voltage outputs Vo$^+$ and Vo$^-$, respectively. In the second phase, when switches 530, 532, 534, 536, 538 and 540 are open and switches 531, 533, 535, 537, 539 and 541 are close, the op amp 510 holds the voltage sampled by capacitors 520 and 522 at the outputs Vo$^+$ and Vo$^-$, respectively. Furthermore, the capacitors 521 and 523 sample the voltage at the outputs Vo$^+$ and Vo$^-$, respectively, so that the circuit 500 holds the output during a subsequent first phase.

In one embodiment, for example, a sample and hold circuit configured to operate in a first phase and a second phase, is provided. The sample and hold circuit may include, but is not limited to, a first capacitor, a second capacitor, an operational amplifier having an input and an output, and a plurality of switches selectively coupling the first capacitor, the second capacitor and the operational amplifier, wherein the plurality of switches are configured to receive a plurality of control signals such that in the first phase the first capacitor is configured to be coupled between an input of the sample and hold circuit and ground and the second capacitor is configured to be coupled between the input of the operational amplifier and the output of the operational amplifier, and in the second phase the first capacitor is configured to be coupled between the input of the operational amplifier and the output of the operational amplifier and the second capacitor is configured to be coupled between the output of the operational amplifier and ground. A first switch of the plurality of switches may be coupled between the first capacitor and the input of the sample and hold circuit, a second switch of the plurality of switches may be coupled between the first capacitor and the output of the operational amplifier, a third switch of the plurality of switches may be coupled between the first capacitor and the input of the operational amplifier, a fourth switch of the plurality of switches may be coupled between the first capacitor and ground, a fifth switch of the plurality of switches may be coupled between the input of the operational amplifier and the second capacitor, and a sixth switch of the plurality of switches may be coupled between the second capacitor and ground. The first switch, the fourth switch and the fifth switch may be configured to receive a first control signal. The second switch, the third switch and the sixth switch may be configured to receive a second control signal, wherein the second control signal is an inverse of the first control signal In the first phase, an output of the sample and hold circuit may be substantially equal to the output of the sample and hold circuit in a prior second phase, and in the second phase the output of the sample and hold circuit may be substantially equal to an input to the sample and hold circuit during the first phase delayed by one-half clock cycle. In the first phase the first capacitor may be electrically isolated from the operational amplifier and the second capacitor. The sample and hold circuit may further include a third capacitor and a fourth capacitor, wherein the plurality of switches are configured to selectively couple the third capacitor, the fourth capacitor and the operational amplifier and to receive the plurality of control signals such that in the first phase the third capacitor is configured to be coupled between a second input of the sample and hold circuit and ground and the fourth capacitor is configured to be coupled between a second input of the operational amplifier and a second output of the operational amplifier, and in the second phase the third capacitor is configured to be coupled between the second input of the operational amplifier and the second output of the operational amplifier and the fourth capacitor is configured to be coupled between the second output of the operational amplifier and ground. A seventh switch of the plurality of switches may be coupled between the third capacitor and a second input of the sample and hold circuit, a eighth switch of the plurality of switches may be coupled between the third capacitor and a second output of the operational amplifier, a ninth switch of the plurality of switches may be coupled between the third capacitor and a second input of the operational amplifier, a tenth switch of the plurality of switches may be coupled between the third capacitor and ground, an eleventh switch of the plurality of switches may be coupled between the second input of the operational amplifier and the fourth capacitor, and a twelfth switch of the plurality of switches may be coupled between the fourth capacitor and ground. The seventh switch, the tenth switch and the eleventh switch may be configured to receive a first control signal and the eighth switch, the ninth switch and the twelfth switch may be configured to receive a second control signal, wherein the second control signal is an inverse of the first control signal. In the first phase the third capacitor may be electrically isolated from the operational amplifier and the fourth capacitor. The operational amplifier may not be reset between the first phase and the second phase. Further, the sample and hold circuit may be configured to sample an automotive radar signal.

In another embodiment, for example, a sample and hold circuit is provided. The sample and hold circuit may include, but is not limited to a first switch having a first end and a second end, wherein the first end of the first switch is configured to receive a first input voltage, a second switch having a first end and a second end, wherein the first end of the second switch is coupled to the second end of the first switch, a first capacitor having a first end and a second end, wherein the first end of the first capacitor is coupled to the second end of the first switch, a third switch having a first end and a second end, wherein the first end of the third switch is coupled to the second end of the first capacitor, a fourth switch having a first end and a second end, wherein the first end of the fourth switch is coupled to the second end of the first capacitor and the second end of the fourth switch is coupled to a ground, an operational amplifier having a first input, a second input and a first output, wherein the first input is coupled to the second end of the third switch and the first output is connected to the second end of the second switch, a fifth switch having a first end and a second end, wherein the first end of the fifth switch is coupled to the second end of the third switch, a second capacitor having a first end and a second end, wherein the first end of the second capacitor is coupled to the first output of the operational amplifier and the second end of the second capacitor is coupled to the second end of the fifth switch, and a sixth switch having a first end and a second end, wherein the first end of the sixth switch is coupled to the second end of the second capacitor and the second end of the sixth switch is coupled to the ground. The second input of the operational amplifier may be coupled to ground. The first switch, third switch, and fifth switch may be configured to receive a first control signal and the second switch, fourth switch, and sixth switch may be configured to receive a second control signal. In a first phase the first switch, third switch and fifth switch may be closed and the second switch, fourth switch and sixth switch may be open and in a second phase the first switch, third switch and fifth switch may be open and the second switch, fourth switch and sixth switch may be closed. The sample and hold circuit of claim may further includes a seventh switch having a first end and a second end, wherein the first end of the seventh switch is configured to receive a second input voltage, a eighth switch having a first end and a second end, wherein the first end of the eighth switch is coupled to the second end of the seventh switch, a third capacitor having a first end and a second end, wherein the first end of the third capacitor is coupled to the second end of the seventh switch, a ninth switch having a first end and a second end, wherein the first end of the ninth switch is coupled to the second end of the third capacitor, a tenth switch having a first end and a second end, wherein the first end of the tenth switch is coupled to the second end of the third capacitor and the second end of the tenth switch is coupled to ground, an eleventh switch having a first end and a second end, wherein the first end of the eleventh switch is coupled to the second end of the ninth switch, a fourth capacitor having a first end and a second end, wherein the first end of the fourth capacitor is coupled to a second output of the operational amplifier and the second end of the fourth capacitor is coupled to the second end of the eleventh switch, a twelfth switch having a first end and a second end, wherein the first end of the twelfth switch is coupled to the second end of the fourth capacitor and the second end of the twelfth switch is coupled to ground, wherein the second input of the operational amplifier is coupled to the second end of the ninth switch and the second output is connected to the second end of the eighth switch. The seventh switch, ninth switch, and eleventh switch may be configured to receive the first control signal and the eighth switch, tenth switch, and twelfth switch may be configured to receive the second control signal. In the first phase the seventh switch, ninth switch, and eleventh switch may be closed and the eighth switch, tenth switch, and twelfth switch may be open and in the second phase the seventh switch, ninth switch, and eleventh switch may be open and the eighth switch, tenth switch, and twelfth switch may be closed. The operational amplifier may not be reset between the first phase and the second phase.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. A sample and hold circuit configured to operate in a first phase and a second phase, comprising:
   a first capacitor;
   a second capacitor;
   an operational amplifier having an input and an output; and
   a plurality of switches selectively coupling the first capacitor, the second capacitor and the operational amplifier,
   wherein the plurality of switches are configured to receive a plurality of control signals such that in the first phase the first capacitor is configured to be coupled between an input of the sample and hold circuit and ground and the second capacitor is configured to be coupled between the input of the operational amplifier and the output of the operational amplifier, and in the second phase the first capacitor is configured to be coupled between the input of the operational amplifier and the output of the operational amplifier and the second capacitor is configured to be coupled between the output of the operational amplifier and ground,
   wherein a first switch of the plurality of switches is directly coupled between the first capacitor and the input of the sample and hold circuit, a second switch of the plurality of switches is directly coupled between the first capacitor and the output of the operational amplifier, a third switch of the plurality of switches is directly coupled between the first capacitor and the input of the operational amplifier, a fourth switch of the plurality of switches is directly coupled between the first capacitor and ground, a fifth switch of the plurality of switches is directly coupled between the input of the operational amplifier and the second capacitor, and a sixth switch of the plurality of switches is directly coupled between the second capacitor and ground.

2. The sample and hold circuit of claim 1, wherein the first switch, the fourth switch and the fifth switch are configured to receive a first control signal.

3. The sample and hold circuit of claim 2, wherein the second switch, the third switch and the sixth switch are configured to receive a second control signal, wherein the second control signal is an inverse of the first control signal.

4. The sample and hold circuit of claim 1, wherein in the first phase an output of the sample and hold circuit is substantially equal to the output of the sample and hold circuit in a prior second phase, and in the second phase the output of the sample and hold circuit is substantially equal to an input to the sample and hold circuit during the first phase delayed by one-half clock cycle.

5. The sample and hold circuit of claim 1, wherein in the first phase the first capacitor is electrically isolated from the operational amplifier and the second capacitor.

6. The sample and hold circuit of claim 1, further comprising:
   a third capacitor; and
   a fourth capacitor,
   wherein the plurality of switches are configured to selectively couple the third capacitor, the fourth capacitor and the operational amplifier and to receive the plurality of control signals such that in the first phase the third capacitor is configured to be coupled between a second input of the sample and hold circuit and ground and the fourth capacitor is configured to be coupled between a second input of the operational amplifier and a second output of the operational amplifier, and in the second phase the third capacitor is configured to be coupled between the second input of the operational amplifier and the second output of the operational amplifier and the fourth capacitor is configured to be coupled between the second output of the operational amplifier and ground.

7. The sample and hold circuit of claim 6, wherein a seventh switch of the plurality of switches is coupled between the third capacitor and a second input of the sample and hold circuit, a eighth switch of the plurality of switches is coupled between the third capacitor and a second output of the operational amplifier, a ninth switch of the plurality of switches is coupled between the third capacitor and a second input of the operational amplifier, a tenth switch of the plurality of switches is coupled between the third capacitor and ground, an eleventh switch of the plurality of switches is coupled between the second input of the operational amplifier and the fourth capacitor, and a twelfth switch of the plurality of switches is coupled between the fourth capacitor and ground.

8. The sample and hold circuit of claim 7, wherein the seventh switch, the tenth switch and the eleventh switch are configured to receive a first control signal and the eighth switch, the ninth switch and the twelfth switch are configured to receive a second control signal, wherein the second control signal is an inverse of the first control signal.

9. The sample and hold circuit of claim 8, wherein in the first phase the third capacitor is electrically isolated from the operational amplifier and the fourth capacitor.

10. The sample and hold circuit of claim 9, wherein the operational amplifier is not reset between the first phase and the second phase.

11. The sample and hold circuit of claim 6, wherein the sample and hold circuit is configured to sample an automotive radar signal.

12. A sample and hold circuit, comprising:
   a first switch having a first end and a second end, wherein the first end of the first switch is configured to receive a first input voltage;
   a second switch having a first end and a second end, wherein the first end of the second switch is directly coupled to the second end of the first switch;
   a first capacitor having a first end and a second end, wherein the first end of the first capacitor is directly coupled to the second end of the first switch;
   a third switch having a first end and a second end, wherein the first end of the third switch is directly coupled to the second end of the first capacitor;
   a fourth switch having a first end and a second end, wherein the first end of the fourth switch is directly coupled to the second end of the first capacitor and the second end of the fourth switch is coupled to a ground;
   an operational amplifier having a first input, a second input and a first output, wherein the first input is directly coupled to the second end of the third switch and the first output is directly coupled to the second end of the second switch;

a fifth switch having a first end and a second end, wherein the first end of the fifth switch is directly coupled to the second end of the third switch;

a second capacitor having a first end and a second end, wherein the first end of the second capacitor is directly coupled to the first output of the operational amplifier and the second end of the second capacitor is directly coupled to the second end of the fifth switch; and a sixth switch having a first end and a second end, wherein the first end of the sixth switch is directly coupled to the second end of the second capacitor and the second end of the sixth switch is coupled to the ground.

13. The sample and hold circuit of claim 12, wherein the second input of the operational amplifier is coupled to ground.

14. The sample and hold circuit of claim 13, wherein the first switch, third switch, and fifth switch are configured to receive a first control signal and the second switch, fourth switch, and sixth switch are configured to receive a second control signal.

15. The sample and hold circuit of claim 14, wherein in a first phase the first switch, third switch and fifth switch are closed and the second switch, fourth switch and sixth switch are open and in a second phase the first switch, third switch and fifth switch are open and the second switch, fourth switch and sixth switch are closed.

16. The sample and hold circuit of claim 15, further comprising:

a seventh switch having a first end and a second end, wherein the first end of the seventh switch is configured to receive a second input voltage;

a eighth switch having a first end and a second end, wherein the first end of the eighth switch is coupled to the second end of the seventh switch;

a third capacitor having a first end and a second end, wherein the first end of the third capacitor is coupled to the second end of the seventh switch;

a ninth switch having a first end and a second end, wherein the first end of the ninth switch is coupled to the second end of the third capacitor;

a tenth switch having a first end and a second end, wherein the first end of the tenth switch is coupled to the second end of the third capacitor and the second end of the tenth switch is coupled to ground;

an eleventh switch having a first end and a second end, wherein the first end of the eleventh switch is coupled to the second end of the ninth switch;

a fourth capacitor having a first end and a second end, wherein the first end of the fourth capacitor is coupled to a second output of the operational amplifier and the second end of the fourth capacitor is coupled to the second end of the eleventh switch;

a twelfth switch having a first end and a second end, wherein the first end of the twelfth switch is coupled to the second end of the fourth capacitor and the second end of the twelfth switch is coupled to ground, wherein the second input of the operational amplifier is coupled to the second end of the ninth switch and the second output is connected to the second end of the eighth switch.

17. The sample and hold circuit of claim 16, wherein the seventh switch, ninth switch, and eleventh switch are configured to receive the first control signal and the eighth switch, tenth switch, and twelfth switch are configured to receive the second control signal.

18. The sample and hold circuit of claim 17, wherein in the first phase the seventh switch, ninth switch, and eleventh switch are closed and the eighth switch, tenth switch, and twelfth switch are open and in the second phase the seventh switch, ninth switch, and eleventh switch are open and the eighth switch, tenth switch, and twelfth switch are closed.

19. The sample and hold circuit of claim 15, wherein the operational amplifier is not reset between the first phase and the second phase.

* * * * *